(12) United States Patent
Kozlowski et al.

(10) Patent No.: US 6,498,331 B1
(45) Date of Patent: Dec. 24, 2002

(54) METHOD AND APPARATUS FOR ACHIEVING UNIFORM LOW DARK CURRENT WITH CMOS PHOTODIODES

(75) Inventors: Lester J. Kozlowski, Simi Valley, CA (US); Richard A. Mann, Torrance, CA (US)

(73) Assignee: Pictos Technologies, Inc., Newport Beach, CA (US)

( * ) Notice: Subject to any disclaimer, the term of this patent is extended or adjusted under 35 U.S.C. 154(b) by 0 days.

(21) Appl. No.: 09/468,696

(22) Filed: Dec. 21, 1999

(51) Int. Cl.[7] .............................................. H01L 27/00

(52) U.S. Cl. ....................... 250/208.1; 257/292; 348/308

(58) Field of Search ...................... 250/370.08, 370.14, 250/208.1, 214 R; 257/291, 292, 443; 348/300, 301, 302, 307, 308

(56) References Cited

U.S. PATENT DOCUMENTS

| | | | |
|---|---|---|---|
| 4,249,122 A | 2/1981 | Widlar | 323/313 |
| 4,463,383 A | 7/1984 | Soneda et al. | 358/212 |
| 4,466,018 A | 8/1984 | Soneda et al. | 358/213 |
| 4,676,761 A | 6/1987 | Poujis | 445/3 |
| 4,794,247 A | 12/1988 | Stineman, Jr. | 250/214 A |
| 5,043,820 A | 8/1991 | Wyles et al. | 358/213.28 |
| 5,083,016 A | 1/1992 | Wyles et al. | 250/208 |
| 5,296,696 A | 3/1994 | Uno | 250/208 |
| 5,345,266 A | 9/1994 | Denyer | 348/300 |
| 5,471,515 A | 11/1995 | Fossum et al. | 377/60 |
| 5,541,402 A | 7/1996 | Ackland et al. | 250/208 |
| 5,576,763 A | 11/1996 | Ackland et al. | 348/308 |
| 5,587,596 A | 12/1996 | Chi et al. | 257/223 |
| 5,608,243 A | 3/1997 | Chi et al. | 257/249 |
| 5,892,540 A * | 4/1999 | Kozlowski et al. | 250/208.1 |
| 6,242,728 B1 * | 6/2001 | Merrill et al. | 250/208.1 |

OTHER PUBLICATIONS

L.J. Kozlowski, et al., "Theoretical basis and experimental confirmation: why a CMOS imager is superior to a CCD," *SPIE*, The International Society for Optical Engineering, vol. 3698, pp. 388–396, Apr. 1999.

R.H. Dyck and G.P. Weckler, "Integrated Arrays of Silicon Photodetectors for Image Sensing," *IEEE Transactions on Electron Devices*, vol. ED–15, No. 4, pp. 196–201, Apr. 1968.

James D. Plummer and James D. Meindl, "MOS Electronics for a Portable Reading Aid for the Blind," *IEEE Journal of Solid–State Circuits*, pp. 111–119, Apr. 1972.

Norio Koike, et al., "MOS Area Sensor: Part I–Design Consideration and Performance of an n–p–n Structure 484× 384 Element Color MOS Imager," *IEEE Transactions on Electron Devices*, vol. ED–27, No. 8, pp. 1676–1681, Aug. 1980.

Shinya Ohba, et al., "MOS Area Sensor: Part II–Low–Noise MOS Area Sensor with Antiblooming Photodiodes," *IEEE Transactions on Electron Devices*, vol. ED–27, No. 8, pp. 1682–1687, Aug. 1980.

EG&G Reticon Sales Catalog, *High–Speed Solid State Image Sensor Array*, RA2568N, pp. 179–186.

EG&G Reticon Sales Catalog, *Solid State Sensor Arrays for Part Nos. RA0100A/RA0128N*, pp. 163–170.

(List continued on next page.)

*Primary Examiner*—Kevin Pyo
(74) *Attorney, Agent, or Firm*—Christopher J. Rourk; Akin Gump Strauss Hauer & Feld, LLP

(57) ABSTRACT

An apparatus and method for achieving uniform low dark currents with CMOS photodiodes. A threshold voltage of a reset FET is set to an appropriate value such that the dark current from a photodiode is actively removed through the reset FET during signal integration. This reduces the dark current by over 3 orders of magnitude as compared to conventional active pixel sensors, without requiring pinned photodiodes.

19 Claims, 1 Drawing Sheet

OTHER PUBLICATIONS

EG&G Reticon Sales Catalog, *Solid State Image Sensor Array for Part No. RA0256B*, pp. 171–178.

Haruhisa Ando, et al., "Design Consideration and Performance of a New MOS Imaging Device," *IEEE Transactions on Electron Devices*, vol. ED–32, No. 8, pp. 1484–1489, Aug. 1985.

Nobuyoshi Tanaka et al., "A Novel Bipolar Imaging Device with Self–Noise–Reduction Capability," *IEEE Transactions on Electron Devices*, vol. 36, No. 1, pp. 31–38, Jan. 1989.

Weckler, G.P., "Storage Mode Operation of a Phototransistor and its Adaptation to Integrated Arrays for Image Detection," *IEDM*, Oct. 1966, (Abstract Only) No known paper available from professional document delivery service.

Nobuyoshi Tanaka, et al., "A Low–Noise Bi–CMOS Linear Image Sensor with Auto–Focusing Function," *IEEE Transactions on Electron Devices*, vol. 36, No. 1, pp. 39–45, Jan. 1989.

N. Tanaka, S. Hashimoto, M. Shinohara, S. Sugawa, M. Morishita, S. Matsumora, Y. Nakamura and T. Ohmi, "A 310k Pixel Bipolar Imager (BASIS)," *ISSCC*, 1989.

Gene P. Wecker, "Charge storage lights the way for solid–state image sensors," *Electronics*, pp. 75–78, May 1, 1967.

Gene P. Weckler, "Operation of p–n Junction Photodetectors in a Photon Flux Integrating Mode," *IEEE Journal of Solid–State Circuits*, vol. SC–2, No. 3, pp. 65–73, Sep. 1967.

Gene P. Weckler and Rudolph H. Dyck, "Integrated Arrays of Silicon Photodetectors for Image Sensing," *WESCON67 Technical Papers*, Western Electronic Show and Convention, Session 13: Solid State Imaging, an Evolving Technology, Aug. 22–25, 1967.

L.J. Kozlowski et al., "Comparison of Passive and Active Pixel Schemes for CMOS Visible Imagers," *SPIE*, vol. 3360, Apr. 1998.

Ming–Jer Chen, et al., "Weak Inversion Charge Injection in Analog MOS Switches," *IEEE Journal of Solid–State Circuits*, vol. 30, No. 5, pp. 604–606, May 1995.

Peter W. Fry, et al., "Fixed–Pattern Noise in Photomatrices," *IEEE Journal of Solid–State Circuits*, vol. SC–5, No. 5, pp. 250–254.

M. DeGrauwe, et al., "Special Correspondence: A Micropower CMOS–Instrumentation Amplifier," *IEEE Journal of Solid–State Circuits*, vol. SC–20, No. 3, Jun. 1985.

Letter dated Jul. 31, 1998, from Gene Weckler, RAD–ICON Imaging Corp., addressed to Mark Wettler.

L. J. Kozlowski, J. Luo and A. Tomasini, *Performance Limits in Visible and Infrared Imager Sensors*, IEDM, Technical Digest, Dec. 5–8, 1999, pp. 36.1–4.

Richard M. Swanson and James D. Meindl, *Ion–Implanted Complementary MOS Transistors in Low–Voltages Circuits*, IEEE Journal of Solid–State Circuits, vol. SC–7, No. 2, Apr. 1972.

* cited by examiner

METHOD AND APPARATUS FOR ACHIEVING UNIFORM LOW DARK CURRENT WITH CMOS PHOTODIODES

BACKGROUND OF THE INVENTION

1. Field of the Invention

The present invention relates generally to the field of CMOS imagers, and more particularly to an apparatus and method for achieving uniform low dark current with CMOS photodiodes.

2. Description of the Related Art

Visible imaging systems implemented in CMOS have the potential for significant reductions in cost and power requirements, as compared to traditional CCDs. Due to the advantages offered by CMOS imagers, there has been considerable effort to develop active-pixel sensor (APS) devices. Active-pixel sensors can provide low read noise comparable or superior to scientific grade CCD systems. Prior art active-pixel CMOS imagers, however, suffer from unacceptable levels of "dark current." Dark current is electronic signal noise present in the pixel outputs that is independent of the image being sensed and that is present even when the pixel array is not being exposed to an image. In other words, dark current is present even when substantially no light is incident upon the image sensing area.

In most CMOS processes, it is generally difficult to reduce the dark current through process mitigation. Even if certain adjustments could be made to the CMOS processes to reduce the dark current for 0.8 $\mu$m or 0.5 $\mu$m design rules, as the designs are migrated to 0.25 $\mu$m or 0.18 $\mu$m CMOS processes, the dark current problems will only increase.

One approach to reduce the dark current is to use a pinned photodiode, as taught by Lee et al. in U.S. Pat. No. 5,625, 210, entitled "ACTIVE PIXEL SENSOR INTEGRATED WITH A PINNED PHOTODIODE" issued Apr. 29, 1997 and assigned to the Eastman Kodak Company. The pinned diode approach is undesirable for CMOS applications, however, because the p implant creates a punchthrough barrier. A high bias voltage significantly larger than the standard supply voltage is needed in order to punch through the p device in order to not compromise the dynamic range. Furthermore, without proper process controls, experiments have shown that pinned photodiodes can actually increase the dark current.

Thus, it would be desirable to be able to reduce the dark current associated with CMOS imagers, without relying on process adjustments or pinned photodiodes.

SUMMARY OF THE INVENTION

The present invention is an apparatus and method for achieving uniform low dark currents with CMOS photodiodes. A threshold voltage of a reset FET in an active pixel sensor is set to an appropriate value such that the dark current from a photodiode is actively removed through the reset FET. This reduces the dark current by over 3 orders of magnitude as compared to conventional active pixel sensors, without requiring pinned photodiodes.

According to the present invention, the threshold voltage should be set per the simplified expression:

$$V_{T_{Optimum}} = V_x \left[ \ln\left( \frac{\mu \frac{W_{rst}}{L_{rst}} C_{ox} V_x^2}{2 J_{dark} A_{det}} \right) \right] - V_x$$

where $V_x = nkT/e$ n is the ideality of the reset MOSFET (about 1.5 for well-designed mixed-signal CMOS processes), $J_{dark}$ is the dark current density for the photodetector, $A_{det}$ is the photodetector area, $\mu$ is the MOSFET mobility, $W_{rst}$ is the width of the reset MOSFET, $L_{rst}$ is the length of the reset MOSFET, and $C_{ox}$ is the MOSFET capacitance density. For example for 0.5$\mu$m CMOS where we assume a subthreshold ideality of 1.5 along with $J_{dark}$=2 nA/cm$^2$, $A_{det}$=8.78×10$^{-7}$ cm$^2$ (28% optical fill factor for 5.6$\mu$m×5.6$\mu$m pixel), electron mobility $\mu$600 cm$^2$/V-sec, $W_{rst}$=1.3$\mu$m, $L_{rst}$=m, 1$\mu$m, and $C_{ox}$=4.6× 10$^{-7}$ F/cm$^2$ for 90Åoxide thickness, the optimum threshold voltage should be about 0.760V to null the dark current at 295 K.

Thus, by raising the threshold voltage $V_t$ for the reset transistor from 0.55 to approximately 0.76 volts for a 0.5 $\mu$m process, the typical CMOS photodiode dark current of about 1 nA/cm$^2$ can be balanced off. This results in a zero net dark current, independent of the integration time. The present invention is similarly applicable to other CMOS processes (0.25 $\mu$m, 0.18 $\mu$m, etc.), and a respective optimized threshold value for these other processes can be determined by using the standard MOSFET electrical parameters associated with each process.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide an apparatus and method for achieving uniform low dark current with CMOS photodiodes.

Figure 1:
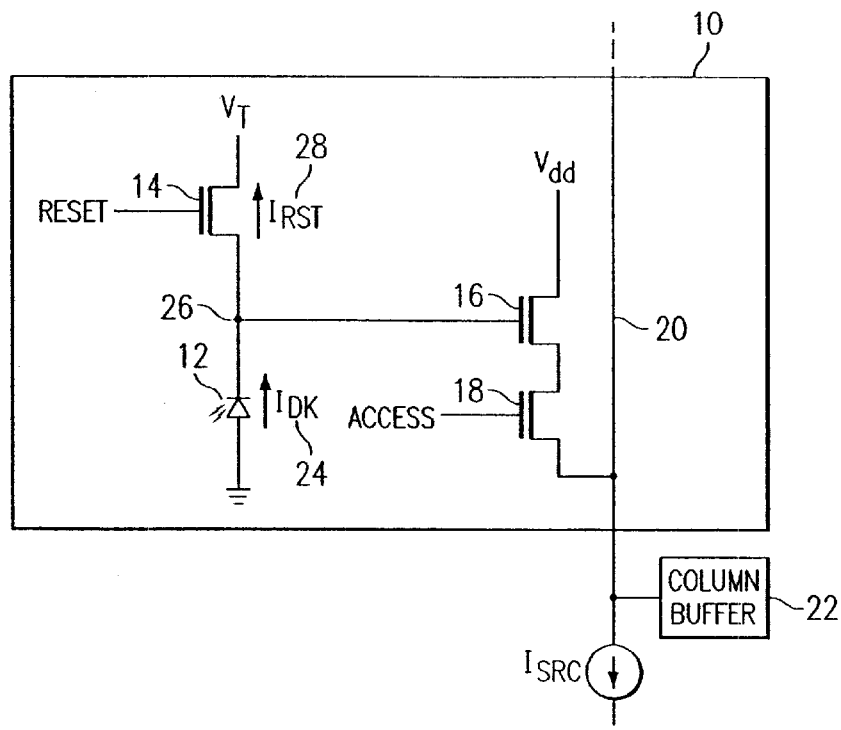
FIG. 1 is schematic of a three-transistor active pixel sensor configured according to the present invention.

FIG. 1 illustrates a three-transistor active pixel sensor 10 that can advantageously apply the teachings of the present invention. In the preferred embodiment, each pixel 10 comprises a photodetector, such as a photodiode 12, which connects to a reset FET 14 and to a source follower amplifier FET 16. An access FET 18 connects the pixel output to a bus line 20, which in turn connects to a column buffer 22. The bus line 20 connects all the pixel outputs in a column of a photodetector array to the column buffer. A CMOS imager may be formed by a plurality of active pixel sensors 10 arranged in rows and columns to produce a two-dimensional array.

The photodiode 12 may comprise a substrate diode, for example, with the silicide cleared. In such an embodiment, which is preferred for compatibility with most CMOS processes, it is necessary to clear the silicide because it is opaque to visible light. Those skilled in the art will appreciate that the pixel 10 is preferably designed in the simplest form to obtain the largest available light detecting area while providing broad spectral response, and compatibility with standard CMOS production processes.

For maximum compatibility with standard submicron CMOS processes the photodiode 12 may be formed at the same time as the lightly doped drain (LDD) implant of n-type MOSFETs for the chosen process; this creates n-on-p photodiode junction in the p-type substrate. Since no additional ion implantation is necessary, the process and wafer cost for the active-pixel circuit 10 are the same as those of standard, high volume digital electronic products.

Figure 2:
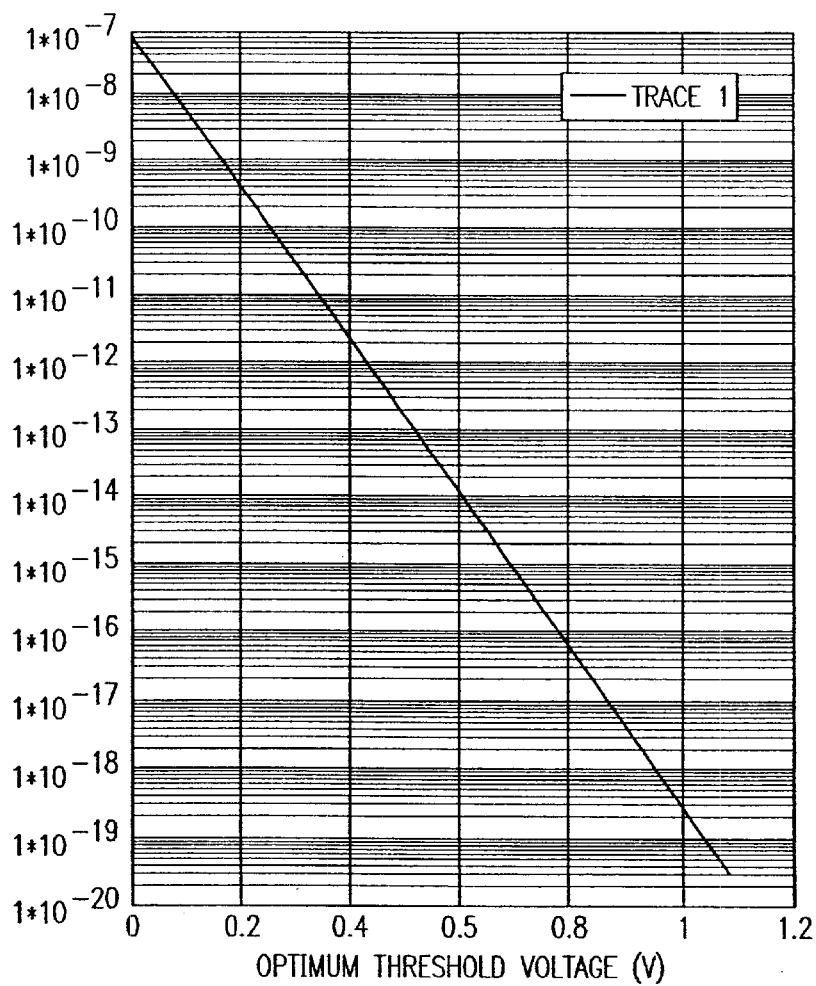
FIG. 2 is a graph of the optimized threshold voltage required for nulling the detector dark current.

Nominally, the photodiode 12 produces a dark current $I_{DK}$ 24 that discharges the node 26 from its reset voltage toward ground. According to the teachings of the present invention, however, if the threshold voltage $V_t$ of the reset FET 14 is set appropriately, the dark current $I_{DK}$ 24 can be "siphoned off" (i.e. subtracted) through the reset FET 14 as the photocurrent is also integrated. In the absence of photocurrent, the net discharge will be zero. For example, in a typical prior art design, the standard threshold voltage $V_t$ of the reset FET 14 for a 0.5 μm CMOS process was on the order of 0.55 volts. This value was chosen by prior art CMOS processes in order to maximize the dynamic range at low supply voltages for general digital circuits. However, by raising the threshold voltage $V_t$ to approximately 0.76 volts for a 0.5 μm process, the typical CMOS photodiode dark current of about 1 nA/cm² can be balanced off. This results in a zero net dark current, independent of the integration time. FIG. 2 shows a graph of detector dark current vs. optimum threshold voltage for 0.5 μm CMOS, given the following assumptions.

According to the present invention, the threshold voltage should be set per the simplified expression:

$$V_{T_{Optimum}} = V_x \left[ \ln \left( \frac{\mu \frac{W_{rst}}{L_{rst}} C_{ox} V_x^2}{2 J_{dark} A_{det}} \right) \right] - V_x$$

where $V_x$=nkT/e n is the ideality of the reset MOSFET (about 1.5 for well-designed mixed-signal CMOS processes), $J_{dark}$ is the dark current density for the photodetector, $A_{det}$ is the photodetector area, μ is the MOSFET mobility, $W_{rst}$ is the width of the reset MOSFET, $L_t$ is the length of the reset MOSFET, and $C_{ox}$ is the MOSFET capacitance density. For example for 0.5 μm CMOS where we assume a subthreshold ideality of 1.5 along with $J_{dark}$=2 nA/cm², $A_{det}$=8.78×10$^{-7}$ cm² (28% optical fill factor for 5.6)1μm×5.6 μm pixel), electron mobility μ=600 cm²/V-sec, $W_{rst}$=1.3 μm, $L_{rst}$=1 μm, and $C_{ox}$=4.6×10$^{-7}$ F/cm² for 90 Å oxide thickness the optimum threshold voltage should be about 0.760 V to null the dark current at 295 K.

The threshold voltage is normally defined as the gate voltage where the MOSFET turns on. In production, for example, manufacturers often measure $V_t$ at a drain current of 1 μA. More fundamentally, however, $V_t$ is essentially the gate-to-source voltage where the MOSFET's operating characteristics depart from square-law to exponential behavior. Above threshold, the MOSFET drain current classically described by the equation:

$$I_{mos} = \mu \frac{W}{2L} C_{oxide}(V_G - V_T - V_S)^2$$

The drain current does not, however, become zero when $(V_G-V_s)<V_T$, i.e., subthreshold -drain current continues to flow at ever smaller levels. While complex expressions can be derived as per Swanson ["Ion-Implanted Complementary MOS Transistors in Low-Voltage Circuits," IEEE JSSC SC-7, No. 2, Apr. 1972, pp. 146–153], the subthreshold MOSFET current flows in an exponential manner that can be approximately expressed as:

$$I_{mos} = \mu \frac{W}{2L} C_{oxide} V_x^2 e^{\left(\frac{V_G-V_T-V_S-V_x}{V_x}\right)}$$

The transistor off-current at $V_{GS}$=0 V is thus:

$$I_{mos} = \mu \frac{W}{2 \cdot L} C_{oxide} V_x^2 e^{\left(\frac{-V_T-V_x}{V_x}\right)}$$

The transistor current at threshold ($V_{GS}=V_T$) is non-zero at:

$$I_{mos} = \mu \frac{W}{2 \cdot L} C_{oxide} V_x^2 e^{(-1)}$$

Using the aforementioned design values, the "off-current" at the nominal threshold of 0.55 V is thus significant, for small-signal analog applications, at about 4.35×10$^{-14}$ A. For the specific case of CMOS active pixel sensors for imaging, for example, the non-optimum threshold voltage can effectively create a photocurrent threshold below which a signal is shunted through the reset FET rather than integrated. The photocurrent threshold of 4.35×10$^{-14}$ A (for the standard $V_T$ of 0.55 V) can thus translate to a failure to integrate the first 9050 electrons of a signal (i.e., for zero detector dark current) if the integration time is 1/30$^{th}$ of a second. This means that the noise floor operationally rises from the read noise level for the active pixel sensor circuit to at least 9050½or 95 e−.

If we instead optimize the MOSFET threshold voltage to enable subthreshold conduction at a level comparable to the detector dark current, both the dark current is nulled and the photocurrent is allowed to integrate in its entirety. For example, a typical CMOS detector dark current density, $J_{dark}$, of 2 nA/cm² corresponds to a detector dark current of ~1.75×10$^{-16}$ A. To null this dark current, the threshold voltage for the reset MOSFET must instead be set to an optimum value of ~0.76 V to enable "off-current" of 1.75× 10$^{-16}$ A. Since the threshold variation for mixed-signal CMOS is typically maintained within 3σ=10 mV, the variation in offset current nulling is negligible at <0.048×10$^{-16}$ A.

In typical CMOS processes, the dark current of the photodiodes is on the order of 1–10 nA/cm². The present invention has lowered the dark current by over 3 orders of magnitude to an integrated dark current of only 0.05 nA/cm² in an SXGA CMOS imager. Also, since the present invention is an "active" solution, the dark currents are relatively uniform across the imager, and not subject to the non-uniformity inherent in a process solution. Further, low-light performance is enhanced because the typical $V_T$ translates to a subthreshold conduction that subtracts the signal photocurrent.

Thus, according to the present invention, tuning the threshold voltage to an appropriate value produces an effective zero net dark current and raises the minimum threshold for photocurrent integration. Since the present invention drains the dark current during integration, there are no additional timing or noise penalties. If the threshold voltage $V_T$ is set too high, however, not enough current will be subtracted, and the noise stemming from the excess dark current will increase. Nevertheless, the less current that is subtracted, the better the accuracy in subtraction. However, the present invention does not need "ideal" photodiodes in order to provide good performance.

Low light level performance is enhanced with all detectors, because photocurrent can always be integrated. However, low light level performance of detectors with lower leakage currents is especially enhanced because the nulling current source adds only the shot noise of the nulling current rather than the higher channel thermal noise of saturation.

Although the present invention has been described with reference to a three-transistor active pixel sensor, the present invention may be applied to virtually any active pixel sensor having a reset transistor. Thus, the present invention is not limited to three-transistor implementations, but may be advantageously applied to four, five or more transistor active pixel sensors. Also, in the disclosed embodiment, electrical values have been determined for a standard 0.5 µm CMOS process. The present invention is similarly applicable to other CMOS processes (0.25 µm, 0.18 µm, etc.), and a respective optimized threshold value for these other processes can be determined by using the standard MOSFET electrical parameters associated with each process.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. An apparatus for reducing dark current associated with a CMOS photodiode, the apparatus comprising;
    a reset transistor connected to the photodiode, the reset transistor having a threshold voltage set to a value that allows dark current to be removed during signal integration; and
    wherein the reset transistor is a MOSFET, and the threshold voltage is set according to the following equation;

$$V_{T_{Optimum}} = V_x \left[ \ln\left( \frac{\mu \frac{W_{rst}}{L_{rst}} C_{ox} V_x^2}{2J_{dark} A_{det}} \right) \right] - V_x$$

where $V_x = nkT/e$ n is the ideality of a reset MOSFET, $J_{dark}$ is a dark current density for the photodetector, $A_{det}$ is a photodetector area., $\mu$ is a MOSFET mobility, $W_{rst}$ is a width of the reset MOSFET, $L_{rst}$ is a length of the reset MOSFET, and $C_{ox}$ is a MOSFET capacitance density.

2. The apparatus of claim 1, wherein the photodiode is a substrate diode with silicide cleared.

3. The apparatus of claim 1, wherein the photodiode is formed at the same time as a lightly doped drain (LDD) implant of an n-type MOSFET, creating an n-on-p photodiode E junction in a p-type substrate.

4. The apparatus of claim 1, wherein the dark current through the photodiode that is removed by the reset transistor is large enough to provide adequate noise performance and matching characteristics.

5. The apparatus of claim 1, wherein the threshold voltage is set to approximately 0.76 volts for a typical mixed signal 0.5 pm CMOS process.

6. The apparatus of claim 1, wherein the threshold voltage is optimized for a particular CMOS process based upon standard MOSFET electrical parameters associated with the particular CMOS process.

7. A method for reducing dark current associated with a CMOS photodiode in an active pixel sensor, the method comprising:
    setting, a threshold voltage of a reset transistor to a predetermined value; and
    removing the dark current via subthreshold conduction during signal integration,
    wherein the predetermined value is set according to the following equation;

$$V_{T_{Optimum}} = V_x \left[ \ln\left( \frac{\mu \frac{W_{rst}}{L_{rst}} C_{ox} V_x^2}{2J_{dark} A_{det}} \right) \right] - V_x$$

where $V_x = nkT/e$ n is the ideality of a reset MOSFET, $J_{dark}$ is a dark current density for the photodetector, $A_{det}$ is a photodetector area, $\mu$ is a MOSFET mobility, $W_{rst}$ is a width of the reset MOSFET, $L_{rst}$ is a length of the reset MOSFET, and $C_{ox}$ is a MOSFET capacitance density.

8. The method of claim 7, wherein the predetermined value is approximately 0.76 volts for a typical mixed signal 0.5 pm CMOS process.

9. The method claim 7, wherein the threshold voltage is optimized for a particular CMOS process based upon standard MOSFET electrical parameters associated with the particular CMOS process.

10. The method of claim 7, wherein the dark current through the photodiode that is 2 removed by the reset transistor is large enough to provide adequate noise performance and 3 matching characteristics.

11. A CMOS active pixel sensor comprising:
    a photodetector producing a dark current;
    an amplifier FET connected to the photodetector;
    a reset FET, having a threshold voltage VT, connected to a node formed by the photodiode and the amplifier FET; and
    an access FET;
    wherein the threshold voltage VT is set to a predetermined value to drain off the dark current through the reset FET during integration and the threshold voltage is set according to the following equation:

$$V_{T_{Optimum}} = V_x \left[ \ln\left( \frac{\mu \frac{W_{rst}}{L_{rst}} C_{ox} V_x^2}{2J_{dark} A_{det}} \right) \right] - V_x$$

where $V_x = nkT/e$ n is the ideality of a reset MOSFET, $J_{dark}$ is a dark current density for the photodetector, $A_{det}$ is a photodetector area, $\mu$ is a MOSFET mobility, $W_{rst}$ is a width of the reset MOSFET, $L_{rst}$ is a length of the reset MOSFET, and $C_{ox}$ is a MOSFET capacitance density.

12. The CMOS active pixel sensor of claim 11, wherein the photodetector is a photodiode.

13. The CMOS active pixel sensor of claim 12, wherein the photodiode is a substrate diode with silicide cleared.

14. The CMOS active pixel sensor of claim 13, wherein the photodiode is formed at the same time as a lightly doped drain (LDD) implant of an n-type MOSFET, creating an n on -p photodiode junction in a p-type substrate.

15. The CMOS active pixel sensor of claim 11, wherein the dark current through the photodiode that is removed by the reset transistor is large enough to provide adequate noise performance and matching characteristics.

16. The CMOS active pixel sensor of claim 11, wherein the threshold voltage is set to approximately 0.76 volts for a 0.5 pm CMOS process.

17. The CMOS active pixel sensor of claim 11, wherein the threshold voltage is optimized for a particular CMOS process based upon standard MOSFET electrical parameters associated with the particular CMOS process.

18. A CMOS imager comprising a plurality of active pixel sensors, each active pixel sensor comprising:

a photodiode producing a dark current;

an amplifier FET connected to the photodiode;

a reset FET, having a threshold voltage VT, connected to a node formed by the photodiode and the amplifier FET; and an access FET;

wherein the threshold voltage VT is set to a predetermined value such that a subthreshold conduction level of the reset FET is comparable to the photodetector dark current.

19. A CMOS imager having a plurality of active pixel sensors, each active pixel sensor of the type having a photodiode that produces a dark current, and a reset transistor, the improvement characterized by a predetermined threshold voltage connected to the reset transistor, wherein the value of the predetermined threshold voltage allows the dark current to be removed through the reset transistor during photocurrent integration and where a sub-threshold conduction level of the reset FET is comparable to the photodetector dark current.

* * * * *

UNITED STATES PATENT AND TRADEMARK OFFICE
CERTIFICATE OF CORRECTION

PATENT NO.   : 6,498,331 B1
DATED        : December 24, 2002
INVENTOR(S)  : Kozlowski et al.

It is certified that error appears in the above-identified patent and that said Letters Patent is hereby corrected as shown below:

Column 6,
Line 45, replace "photodiode", with -- photodetector --.

Signed and Sealed this

Fifteenth Day of April, 2003

JAMES E. ROGAN
*Director of the United States Patent and Trademark Office*